(12) United States Patent
Wang (10) Patent No.: US 8,933,726 B2
(45) Date of Patent: Jan. 13, 2015

(54) DYNAMIC VOLTAGE SCALING SYSTEM HAVING TIME BORROWING AND LOCAL BOOSTING CAPABILITY

(71) Applicant: National Chung Cheng University, Chia-Yi (TW)

(72) Inventor: Jinn-Shyan Wang, Chia-yi (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 14/136,737

(22) Filed: Dec. 20, 2013

(65) Prior Publication Data
US 2014/0176189 A1 Jun. 26, 2014

(30) Foreign Application Priority Data

Dec. 21, 2012 (TW) .............................. 101149022 A (51) Int. Cl.
| | |
|---|---|
| *H03K 19/0175* | (2006.01) |
| *H03K 19/00* | (2006.01) |
| *G06F 1/00* | (2006.01) |
| *H03K 3/037* | (2006.01) |
| *H03K 5/05* | (2006.01) |
| *H03K 5/1534* | (2006.01) |

(52) U.S. Cl.
CPC .............. *H03K 19/0013* (2013.01); *G06F 1/00* (2013.01); *H03K 3/0375* (2013.01); *H03K 5/05* (2013.01); *H03K 5/1534* (2013.01)
USPC ................. 326/81; 326/68; 326/97; 327/109; 327/333

(58) Field of Classification Search
USPC ....................... 326/63, 68, 80–83, 86, 93–98; 327/108–109, 333
See application file for complete search history.

(56) References Cited

U.S. PATENT DOCUMENTS 6,201,415 B1 * 3/2001 Manglore ........................ 326/98
6,496,038 B1 * 12/2002 Sprague et al. .................. 326/95
(Continued)

OTHER PUBLICATIONS

Burd et al., "A Dynamic Voltage Scaled Microprocessor System", IEEE Journal of Solid-State Circuits, vol. 35, No. 11, Nov. 2000., p. 1571-1580.
(Continued)

*Primary Examiner* — Jason M Crawford
(74) *Attorney, Agent, or Firm* — Muncy, Geissler, Olds & Lowe, P.C.

(57) ABSTRACT

A dynamic voltage scaling system having time borrowing and local boosting capability, including: a time borrowing circuit and a local boost circuit. The time borrowing circuit connected electrically between a primary stage logic circuit and a secondary stage logic circuit is activated by an all-domain clock signal, and then generates an output data to the secondary stage logic circuit based on input data to the primary stage logic circuit. The local boost circuit is connected to a low working voltage line, when input data of the time borrowing circuit lags behind a positive level of said all-domain clock signal, the time borrowing circuit delays fetching data by a flip flop and changes state to produce a warning signal, so that the local boost circuit disconnects its connection with said low working voltage line, and is connected electrically to a high working voltage line.

13 Claims, 12 Drawing Sheets

(56) References Cited

U.S. PATENT DOCUMENTS

| | | | |
|---|---|---|---|
| 7,667,497 B2 * | 2/2010 | Liang et al. | 326/93 |
| 2009/0115469 A1 * | 5/2009 | Cortadella et al. | 327/142 |
| 2010/0287400 A1 * | 11/2010 | Chou et al. | 713/400 |

OTHER PUBLICATIONS

Nowka et al., "A 32-bit PowerPC System-on-a-Chip With Support for Dynamic Voltage Scaling and Dynamic 2 Frequency Scaling", IEEE Journal of Solid-State Circuits, vol. 37, No. 11, Nov. 2002., pp. 1441-1447.

Kaenel et al., "A Voltage Reduction Technique for Battery-Operated Systems", IEEE Journal of Solid-State Circuits, vol. 25, No. 5, Oct. 1990., pp. 1136-1140.

Das et al., "A Self-Tuning DVS Processor Using Delay-Error Detection and Correction", IEEE Journal of Solid-State Circuits, vol. 41, No. 4, Apr. 2006., pp. 792-804.

Das et al., "RazorII: In Situ Error Detection and Correction for PVT and SER Tolerance", IEEE Journal of Solid-State Circuits, vol. 44, No. 1, Jan. 2009., pp. 32-48.

* cited by examiner

DYNAMIC VOLTAGE SCALING SYSTEM HAVING TIME BORROWING AND LOCAL BOOSTING CAPABILITY

This application claims priority for Taiwan patent application no. 101149022 filed on Dec. 21, 2012, the content of which is incorporated by reference in its entirety.

BACKGROUND OF THE INVENTION

1. Field of the Invention

The present invention relates to a dynamic voltage scaling system, and in particular to a dynamic voltage scaling system having time borrowing and local boosting capability.

2. The Prior Arts

Along with the progress and development of its manufacturing process, the circuit density and performance of microprocessor have increased significantly, so that its power consumption is raised. Since battery capacity of a portable system is not sufficient to provide current for large power consumption for long period of time, so that in order to reduce power consumption, a Dynamic Voltage Scaling (DVS) technology is used extensively in digital circuit to reduce the overall power consumption. In general, in the DVS technology, the working voltage of a system can be adjusted properly according to the system requirement, so that power consumption can be reduced along with voltage reduction based on a power of 2 relations. In this respect, it is evident that DVS is capable of achieving significant reduction of power consumption.

Figure 1A:
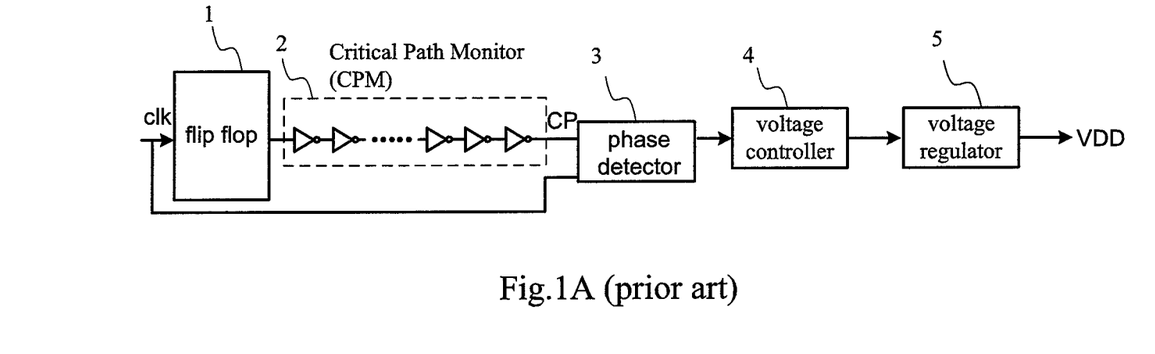
FIGS. 1A and 1B are circuit diagrams of a circuit system designed through using a Dynamic Voltage Scaling (DVS) technology of the prior art.
Figure 1B:
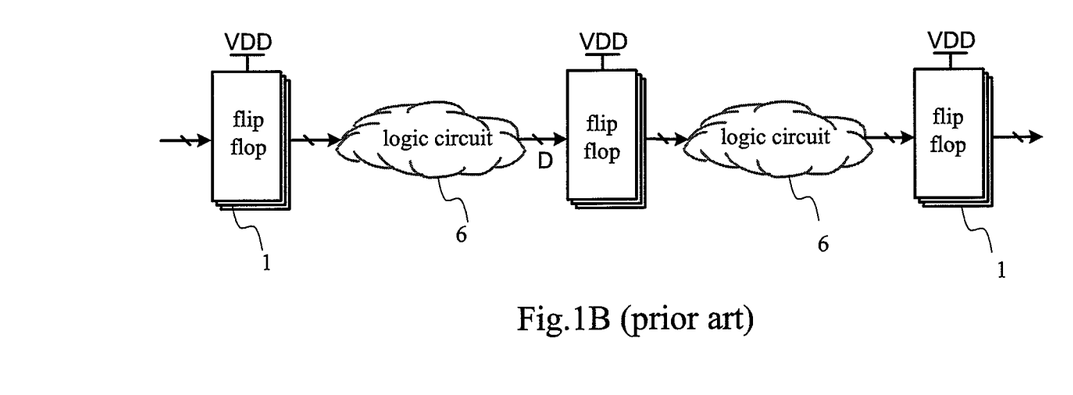

Refer to FIGS. 1A and 1B for circuit diagrams of a circuit system designed through using a Dynamic Voltage Scaling (DVS) technology of the prior art. Also, refer to FIG. 2 for a time sequence signal waveform diagram for circuit system designed through using a Dynamic Voltage Scaling (DVS) technology of the prior art. As shown in the drawings, a flip flop 1 is connected between two adjacent logic circuits 6, and it outputs the voltage level VDD through the processing of a Critical Path Monitor (CPM) 2, a Phase Detector (PD) 3, a Voltage controller 4, and a Voltage Regulator 5. When the circuit is in operation, the clock signal clk will first pass through CPM 2. In case the time delay of signal CP passing through CPM 2 does not exceed the clock period of the system, then the system is in a safe condition, so that the system is able to further reduce the voltage level VDD produced and output by the voltage regulator 5 through the voltage controller 4, hereby further reducing power consumption. Otherwise, in case the time delay of signal CP passing through CPM 2 does exceed the clock period of the system, then the system is in an under-voltage condition, such that the circuit may operate in fault. At this time, the system may raise the voltage produced and output by the voltage regulator 5 through the voltage controller 4. In this approach, the system is able to operate stably at a lower voltage, to achieve optimization of power consumption.

Figure 2:
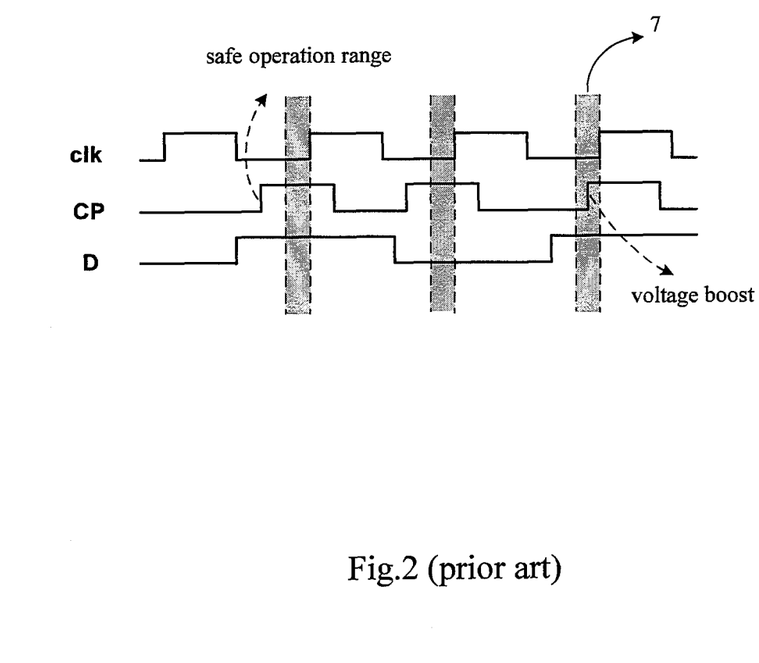
FIG. 2 is a time sequence signal waveform diagram for a circuit system designed through using a Dynamic Voltage Scaling (DVS) technology of the prior art.

In order to achieve system stability, in designing the system, the designer must make sure that the logic circuit 6 in the pipeline is operating normally and correctly. As such, in designing CPM 2, it has first to be able to detect that the CPM 2 is operating in a harmful voltage, before error does occur in operations of logic circuit 6. Therefore, in designing the CPM 2, a design margin 7 has to be reserved to make sure the logic circuit 6 operates correctly. However, considering the process variations, CPM 2 must reflect the harmful voltage before an error does occur in the logic circuit. For this reason, in designing the CPM 2, the worst process variation must be considered. In other words, more process variations have to be tolerated, such that much more design margin has to be reserved for CPM 2. In this way, the circuit can not realize effective voltage scaling, thus not being able to save power consumption efficiently.

Therefore, in order to save more power effectively, David T. Blaauw proposed a Razor-I-based Dynamic Voltage Scaling System (Razor-I DVS). Wherein, it provides a Flip Flop more tolerant of delay fault, to correct effectively delay fault of the system. Meanwhile, it monitors the error rate to adjust voltage of the voltage regulator. Yet, when the concept is proposed to reduce voltage based on the observed error rate by Razor-1, the related researches indicate that when circuit operated in this working voltage, the power saved is less than 10% of the power for error rate 0. For this reason, a Razor-II-based Dynamic Voltage Scaling System (Razor-II DVS) is subsequently proposed, to make the circuit operate near zero error rate. In this approach, circuit complexity is reduced significantly to lower power consumption. Meanwhile, local data recovery of the system is avoided, to reduce system design complexity significantly, in achieving the same effect of system voltage reduction as in Razor-I.

However, it is worth to note that, regardless of Razor-I or Razor-II, when system error occurs, Data Recovery or Instruction Replay must be performed, to bring the system back to normal operation, such that this approach of solving system error requires an additional cycle period or tens of cycle periods. When this happens to a large system work load, it could greatly reduce system data throughput, to affect seriously performance of the system.

Therefore, presently, the design and performance of the dynamic voltage scaling system is not quite satisfactory, and it has much room for improvements.

SUMMARY OF THE INVENTION

In view of the problems and shortcomings of the prior art, the present invention provides a dynamic voltage scaling system having time borrowing and local boosting capability, to overcome the drawbacks and shortcomings of the prior art.

A major objective of the present invention is to provide a dynamic voltage scaling system having time borrowing and local boosting capability. Wherein, a latch is utilized to perform time borrowing for the next stage pipeline logic circuit, meanwhile, it local boosts the working voltage of the next stage pipeline logic circuit, to solve delay fault problem of the pipeline.

Another objective of the present invention is to provide a dynamic voltage scaling system having time borrowing and local boosting capability. Wherein, the delay fault in the DVS system of the prior art is solved effectively without reducing data throughput of the system.

A further objective of the present invention is to provide a dynamic voltage scaling system having time borrowing and local boosting capability, that is capable of raising circuit performance, reducing power consumption, lowering process variations, to achieve dynamic voltage scaling effectively.

In order to achieve the above objective, the present invention provides a dynamic voltage scaling system having time borrowing and local boosting capability, including: a time borrowing circuit, and a local boost circuit. Wherein, the time borrowing circuit is connected electrically between a primary stage logic circuit and a secondary stage logic circuit. The local boost circuit is connected electrically to the time borrowing circuit and the secondary stage logic circuit. Wherein, the time borrowing circuit receives an all-domain clock signal, and generates an output data to the secondary stage logic circuit based on data input to the primary stage logic circuit.

When the data input to the time borrowing circuit lags behind the positive level of the all-domain clock signal, time borrowing circuit delays data fetching of the flip flop, so that the primary stage pipeline can perform time borrowing for the secondary stage pipeline. Normally, the local boost circuit is connected electrically to a low working voltage line when the input data lags behind the positive level of the all-domain clock signal, the time borrowing circuit changes its status and produces a warning signal, so that the local boost circuit disconnects its connection to the low working voltage line based on the warning signal, and it is connected electrically to a high working voltage line, to reduce the operation time of the secondary stage pipeline.

According to an embodiment of the present invention, when the time borrowing circuit produces a warning signal, the circuit utilizes a latch to perform time borrowing through the next stage pipeline; meanwhile, it is connected to a high working voltage line through the local boost circuit, to raise its working voltage, offset its delay fault, and reduce its power consumption.

Furthermore, in order to assure that the next stage pipeline can still operate properly, when performing time borrowing, the latch itself informs a stage delay reduction circuit to reduce time delay of the next stage pipeline. By employing the stage delay reduction circuit, the time borrowed by the primary stage pipeline can be offset and its power consumption can be reduced as well. In one embodiment of the present invention, the stage delay reduction circuit can be implemented by boosting supply voltage. In another embodiment of the present invention, the stage delay reduction circuit can also be implemented by forwarding body-bias Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

The present invention relates to a Dynamic Voltage Scaling (DVS) system having Time borrowing and Local Boosting capability, that is different from the prior art in that, in the present invention, when a delay fault occurs, the system will not stop to solve the delay fault problem. Instead, it utilizes a latch to borrow operation time from the next stage pipeline. Meanwhile, it can raise the operation voltage of the next stage pipeline to offset this delay fault, hereby raising significantly data throughput of the system.

Figure 3:
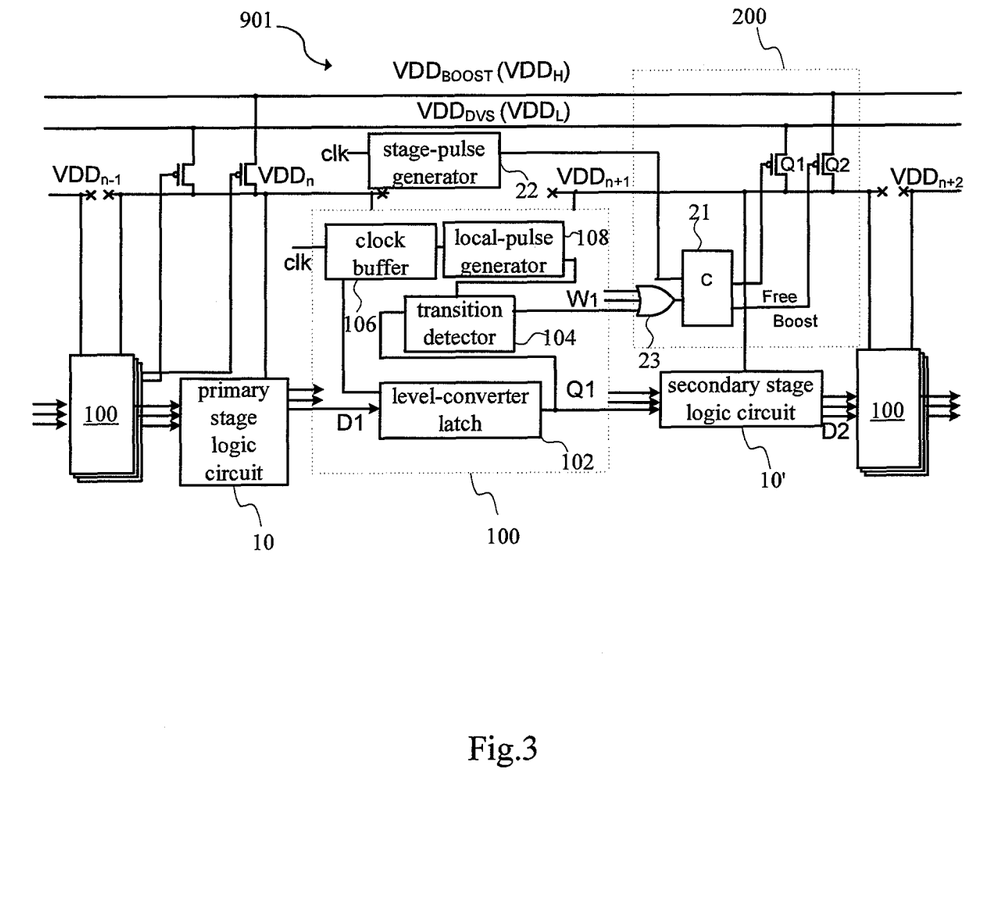
FIG. 3 is a circuit diagram of a Dynamic Voltage Scaling (DVS) system having Time borrowing and Local Boosting capability according to an embodiment of the present invention.

Refer to FIG. 3 for a circuit diagram of a Dynamic Voltage Scaling (DVS) system capable of Time borrowing and Local Boosting according to the present invention. As shown in FIG. 3, the Dynamic Voltage Scaling (DVS) system 901 includes: a time borrowing circuit 100 and a local boost circuit 200. Wherein, the time borrowing circuit 100 is connected electrically between a primary stage logic circuit 10 and a secondary stage logic circuit 10', and upon receiving activation of an all-domain clock signal clk, it generates an output data Q1 to the secondary stage logic circuit 10', based on data D1 input to the primary stage logic circuit 10.

According to an embodiment of the present invention, as shown in FIG. 3, the time borrowing circuit 100 includes a level-converter latch (LCL) 102, connected between the primary stage logic circuit 10 and the secondary stage logic circuit 10'; a transition detector (TD) 104, connected to the level-converter latch (LCL) 102, to generate a warning signal W1; a clock buffer 106, to receive the all-domain clock signal clk and output a clock signal ck, to increase intensity of the clock signal; and a local-pulse generator 108, connected between the clock buffer 106 and transition detector (TD) 104.

The local boost circuit 200 is connected electrically to the time borrowing circuit 100 and the secondary stage logic circuit 10', and normally, it is connected to a low working voltage line $VDD_{DVS}$ ($VDD_L$). As shown in FIG. 3, the local boost circuit 200 includes: a first active switch Q1, a second active switch Q2, a controller 21, and a logic gate 23. Wherein, the controller 21 is connected to the first active switch Q1 and the second active switch Q2, to generate a voltage maintenance signal Free to the base of the first active switch Q1, and generate a voltage boost signal Boost to the base of the second active switch Q2. The logic gate 23 is connected between the time borrowing circuit 100 and the controller 21. The input terminal of the controller 21 is connected electrically to a Stage-Pulse Generator 22, to generate a control signal required by the controller 21.

In the present embodiment, under normal condition, when the pipeline logic is operating normally, the first active switch Q1 is turned on, while the second active switch Q2 is turned off. In the present embodiment, the first active switch Q1 and the second active switch Q2 are p-type metal-oxide-semiconductor field-effect-transistor (MOSFET), with their respective sources connected to a low working voltage line $VDD_{DVS}$ and a high working voltage line $VDD_{BOOST}$, to switch selectively the local boost circuit 200 to the low working voltage line $VDD_{DVS}$, or to the high working voltage line $VDD_{BOOST}$. Therefore, under normal condition, the first active switch Q1 is turned on, while the second active switch Q2 is turned off, so that the pipeline is operated in a lower working voltage $VDD_{DVS}$.

Figure 4:
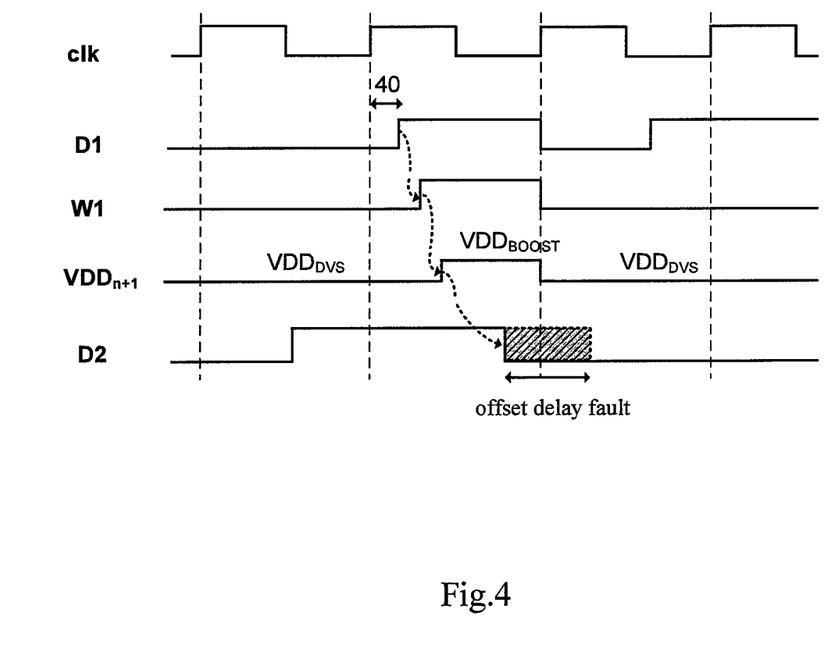
FIG. 4 is a time sequence waveform diagram for signals generated at various nodes of the circuit system according to an embodiment of the present invention.

Then, refer to FIG. 4 for a time sequence waveform diagram for signals generated at various nodes of the circuit system according to the present invention. As shown in FIG. 4, when the input data D1 lags behind the positive level of the all-domain clock signal clk, due to a too long logic operation caused by dynamic voltage scaling of pipeline, the delayed signal will borrow from the next stage pipeline the time borrowing 40 through a Level-Converter Latch 102 in the time borrowing circuit 100, and transmits the delayed signal directly to the next stage pipeline (namely, $VDD_{n+1}$) for operation. In this condition, the delayed input data D1 will make the transition detector (TD) 104 in the time borrowing circuit 100 to change its state, and outputs a warning signal W1 to inform the local boost circuit 200 to generate a control signal, to change the turn-on states of the first active switch Q1 and the second active switch Q2. At this time, the first active switch Q1 is switched to turn-off, while the second active switch Q2 starts to turn-on, so that the connection between the system and the low working voltage line $VDD_{DVS}$ is discounted, and the system is switched to a high working voltage $VDD_{BOOST}$. At this time, secondary stage logic circuit 10' will increase its operation speed due to raise of it working voltage, to offset out the delay fault.

In other words, the present invention utilizes the characteristic of time borrowing from the next stage pipeline, meanwhile performing local boost of voltage for the next stage pipeline. As such, it is able to offset the delay fault, without the need to spend an additional or several cycles to perform data recovery as the Razor-I or -II based DVS of the prior art. Moreover, the circuit system of the present invention utilizes a warning signal to determine if the system is in a dangerous condition, to adjust further the working voltage of the system, and to reduce its overall power consumption.

Figure 5A:
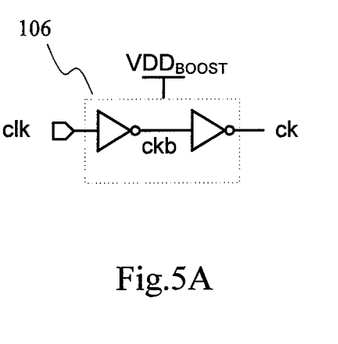
FIG. 5A is a circuit diagram of a clock buffer according to an embodiment of the present invention.
Figure 5B:
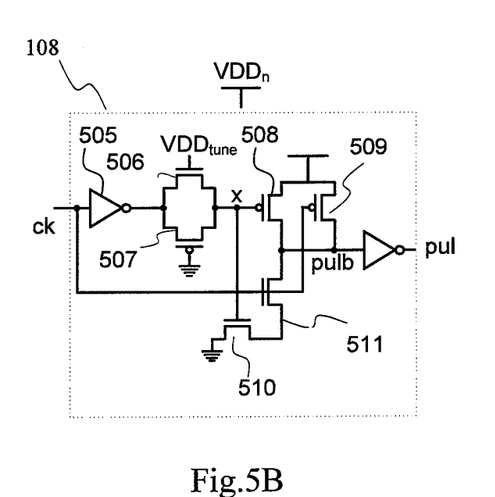
FIG. 5B is a circuit diagram of a Local-Pulse Generator according to an embodiment of the present invention.
Figure 5C:
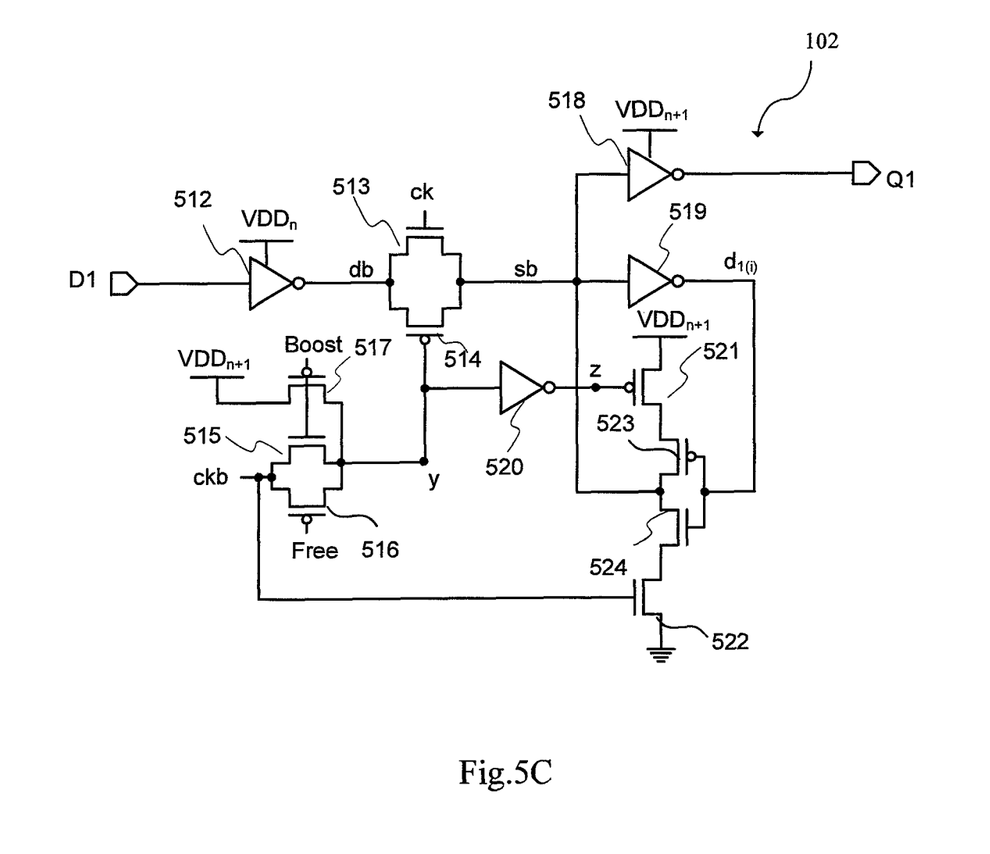
FIG. 5C is a circuit diagram of a Level-Converter Latch according to an embodiment of the present invention.
Figure 5D:
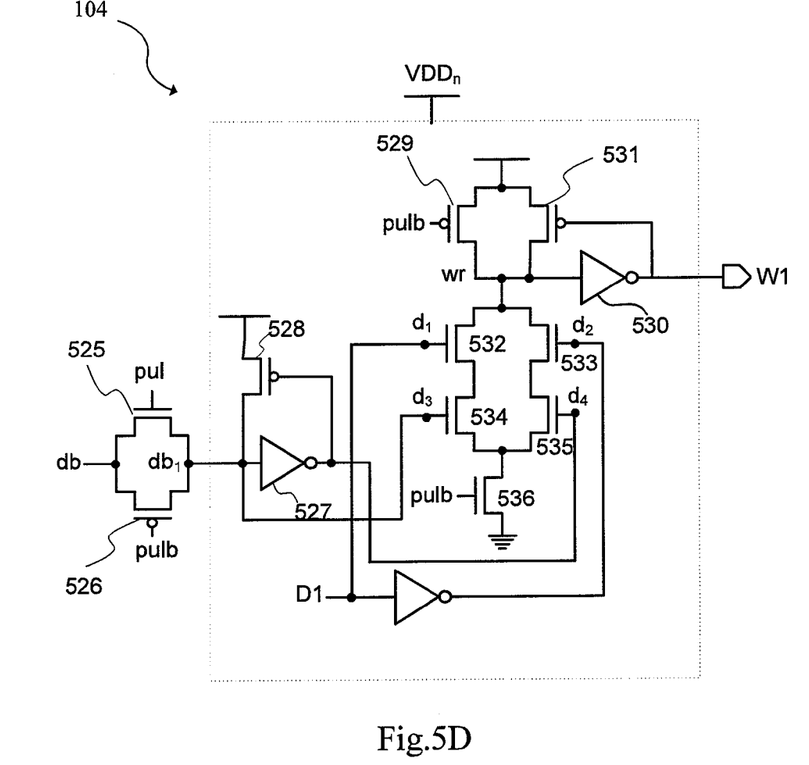
FIG. 5D is a circuit diagram of a Transition Detector according to an embodiment of the present invention.
Figure 6:
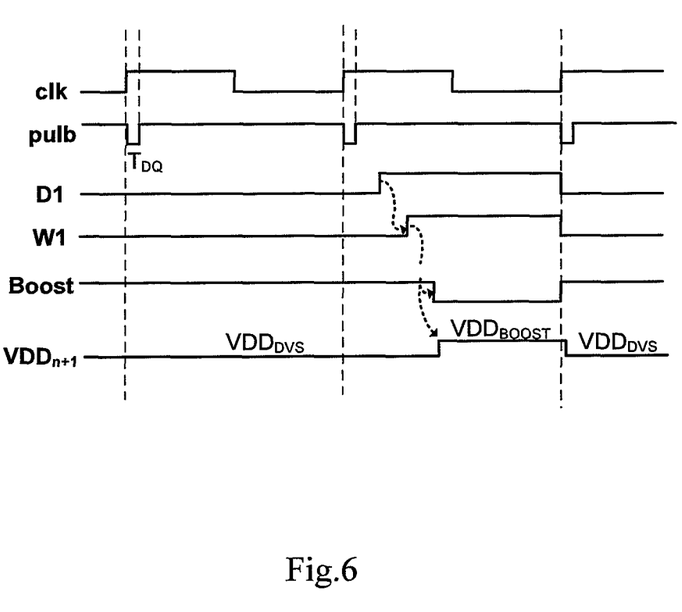
FIG. 6 shows time sequence waveform diagrams for signals generated at various nodes in FIGS. 5A to 5D according to an embodiment of the present invention.

In order to describe in detail structure and characteristics of the present invention, the preferred embodiments are explained together with the attached drawings as follows. Wherein, FIG. 5A is a circuit diagram of a clock buffer according to the present invention. FIG. 5B is a circuit diagram of a Local-Pulse Generator according to the present invention. FIG. 5C is a circuit diagram of a Level-Converter Latch according to the present invention. FIG. 5D is a circuit diagram of a Transition Detector according to the present invention. FIG. 6 shows time sequence waveform diagrams for signals generated at various nodes in FIGS. 5A to 5D according to the present invention.

To be more specific, the clock buffer 106 is used to transfer the external all-domain clock signal clk to be used as an internal signal through intensifying by a buffer, and the function of the local-pulse generator 108 is to generate pulse signals. Since after obtaining the input data D1 by the level-converter latch (LCL) 102, it requires a time delay to transform the input data D1 into the output data Q1, thus this period of time delay is defined as a delayed time $T_{DQ}$. Therefore, after positive level of the all-domain clock signal clk, it has to pass the delayed time $T_{DQ}$, to transform the input data D1 into the output data Q1, In case in the delayed time $T_{DQ}$, the state transition of output data Q1 is normal, then the transition detector (TD) 104 will neglect state transition in delayed time $T_{DQ}$. Therefore, it requires the local-pulse generator 108 to generate a pulse signal having its width the same as delayed time $T_{DQ}$, to control the detection of the transition detector (TD) 104.

In the operation of the local-pulse generator 108, when the clock signal ck is transformed from logic "0" to logic "1", the clock signal ck will pass through an inverter 505, and a transfer gate formed by FETs 506, 507, to produce additional time delay (TD), and that causes the node x to pass through an additional time delay to transform from logic "1" to logic "0", so that in the local-pulse generator 108, when the logic "0" of clock signal ck and logic "1" of node x are input to the NAND gate formed by FETs 508, 509, 510, and 511, then output of node pu1b is at logic "1". When clock signal ck is transformed from logic "0" to logic "1", the node x must pass through a period of time to transform from logic "1" to logic "0". In other words, in a small period of time, both the clock signal ck and node x are at logic "1". At this time, it can be found that the output node pu1b in this period of time is transformed into logic "0". That is to say, the local-pulse generator 108 generates a pulse signal having the same width of the time delay. Wherein, the magnitude of the pulse signal can be controlled by voltage $VDD_{tune}$, the larger the voltage $VDD_{tune}$, the smaller the pulse signal, and vice versa.

When the clock signal ck is at logic "0", the FET 509 is turned on, to charge the node pu1b to logic "1". Wherein, when the clock signal ck is at logic "1", the output voltage pu1 is used to control directly if signal db (FIG. 5D) is sent to transition detector 104 for operation. Therefore, when the output voltage pu1 is at logic "1", the FETs 525 and 526 are turned on, signal db is transferred to node db1 through FETs 525 and 526, and this value is stored in transistor 528. When the output voltage pu1 is at logic "0", FETs 525 and 526 are turned off. The transition detector 104 will start to detect transition by comparing if db1 and D1 are the same. When the all-domain clock signal clk is transformed from logic "1" to logic "0", the FET 509 is turned on, to charge node pu1b to logic "1". Therefore, it shuts down the transition detector 104, so that it will not operate when the all-domain clock signal clk is at logic According to an embodiment of the present invention, as shown in FIG. 5C, the level-converter latch (LCL) 102 includes 4 inverters and 9 transistors. Wherein, the source of PMOS of the first inverter 512 is connected to a primary stage power supply line $VDD_n$. The source of PMOS of the second inverter 518, the source of PMOS of the third inverter 519, the source of PMOS of the fourth inverter 520, the source of the second transistor 517, and the source of the fourth transistor 521 are connected to a secondary stage power supply line $VDD_{n+1}$; while the source of NMOS of the first inverter 512, the source of NMOS of the second inverter 518, the source of NMOS of the third inverter 519, the source of NMOS of the fourth inverter 520, and the source of the eighth transistor 522 are connected electrically to ground.

The input data D1 is input to an input terminal of the first inverter 512, while the input terminal of the first inverter 512 is connected electrically to the source of the sixth transistor 513 and the source of the first transistor 514. The drain of the sixth transistor 513, the drain of the first transistor 514 are connected electrically to the input terminal of the second inverter 518, the input terminal of the third inverter 519, and the drain of the seventh transistor 524.

The output terminal of the second inverter 518 is used to output said output data Q1, the third inverter 519 is connected electrically to the gate of the third transistor 523, and the gate of the seventh transistor 524. An inverter clock signal line ckb is connected electrically to the drain of the ninth transistor 515 and the source of the fifth transistor 516. The clock signal line ck is connected electrically to the gate of the sixth transistor 513. The voltage boost signal Boost is input to the gate of the second transistor 517 and the gate of the ninth transistor 515. The voltage maintenance signal Free is input to the gate of the fifth transistor 516. The drain of the second transistor 517 is connected electrically to the drain of the ninth transistor 515, the drain of the fifth transistor 516, the gate of the first transistor 514, and the input terminal of the fourth inverter 520. According to an embodiment of the present invention, the first to fifth transistors mentioned above are P-type MOSFETs, while the sixth to ninth transistors mentioned above are N-type MOSFETs.

To be more specific, the operations of the level-converter latch (LCL) 102 can be classified into two scenarios. Wherein, the first scenario is that, the input data D1 does not change its state in the positive half period of the all-domain clock signal clk; while the second scenario is that, the input data D1 changes its state in the positive half period of the all-domain clock signal clk. Wherein, when a warning signal W1 is not generated by the circuit, the level of system voltage $VDD_n$ and $VDD_{n-1}$ are both at low working voltage $VDD_{DVS}$, the initial value of voltage maintenance signal Free is at logic "0", while the initial value of voltage boost signal Boost is at logic "1".

(1) Suppose that the input data D1 is at logic "1", and it does not change its state in the positive half period of the all-domain clock signal clk; meanwhile, suppose at this time the all-domain clock signal clk is at logic "1", the node pu1b is at logic "1", and the node Boost is at logic "1", then, at this time the FETs 513, 514, 515, and 516 are turned on, while the FETs 517 and 522 are turned off, so that node sb is at logic "0", and node y is at logic "1". Subsequently, node sb charges the output data $Q_i$ and $d_{1(i)}$ to logic "1" respectively through inverters 518 and 519, to turn FET 524 on; while node y makes node z to be at logic "1" through the fourth inverter 520 to turn FET 521 off.

The operation of the transition detector (TD) 104 is that, when the output voltage is at logic "0", the transition detector (TD) 104 will be pre-charged through FET 529, so as to charge node wr to logic "1". Since the node wr is connected in floating when the output voltage pu1 is at logic "1", so that in order to prevent change of voltage level at this point to cause errors in the subsequent circuits, therefore, an inverter 530 and FET 531 are added to maintain voltage at this point. At this time, since node pu1b is at logic "1", and FETs 525 and 526 are turned on, so node db1 becomes at logic "0" (since the node db1 is connected in floating when the output voltage pu1 is at logic "0", in order to prevent change of voltage level at this point to cause errors in the subsequent circuits, therefore, an inverter 527 and FET 528 are added to maintain voltage at this point). Since in the positive half period, the input data D1 does not change its state, so the signal db does not change its state, such that the nodes d1, d4, pu1 controlling the FETs 532, 535, and 536 are at logic "1", while nodes d2 and d3 are at logic "0", so as to turn off FETs 533 and 534. Node wr does not have a route to discharge, so it remains at logic "1". The warning signal W1 remains at logic "0", to inform the system that, delay fault does not occur at this time.

(2) Suppose that in the positive half period of the all-domain clock signal clk, the input data D1 changes its state from logic "1" into logic "0"; meanwhile, suppose at this time the all-domain clock signal clk is at logic "1", and the node pu1b is also at logic "1", such that when input data D1 is at logic "1", the operations of the circuit are the same as mentioned above. But when the input data D1 changes its state from logic "1" to logic "0", at this time, FETs 513, 514, 515, and 516 are still turned on, while FETs 517 is still turned off, so as to make the node sb to change from logic "0" to become logic "1". Subsequently, node sb discharge output data $Q_1$ and $d_{1(i)}$ to be at logic "0" through inverters 518 and 519.

The operation of the transition detector (TD) 104 is that, when the output data Q1 is at logic "1", nodes d1, d4, and pu1 are at logic "1", while nodes d2 and d3 are at logic "0". At this time, since the output data Q1 changes from logic "1" to become logic "0" and the pu1 becomes logic "0", so node d1 becomes logic "0", node d2 becomes logic "1", while nodes d3 and d4 will keep logic "0" and logic "1" respectively. Therefore, nodes d2 and d4 are at logic "1", while pu1b is also at logic "0", thus forming a discharge route, to made node wr to change from logic "1" to logic "0". At this time, the warning signal W1 will change its state to logic "1", to inform the system that the delay fault does occur.

Under this circumstance, the system will make the voltage boost signal Boost to change its state to logic "0", and the voltage maintenance signal Free to change its state to logic "1". At this time, the secondary stage power supply line $VDD_{n+1}$ is charged to a high working voltage $VDD_{BOOST}$, while FETs 515 and 516 are turned off, and FET 517 is turned on, to charge node y to logic "1" of voltage level $VDD_{n+1}$, to make node z remain at logic "0", and turn on FET 521. Since node y being charged to high working voltage $VDD_{BOOST}$ will turn off FET 514, therefore node sb will be charged by FETs 521 and 523 to a high working voltage $VDD_{BOOST}$ of logic "1", rather than to a low working voltage $VDD_{DVS}$ of logic "1", while the output data Q1 can be kept safely at logic "0", and the time borrowing circuit 100 will not generate additional DC current. In other embodiments, in case the state of the output data Q1 is changed from logic "0" to logic "1", then the output data Q1 will be charged directly to a high working voltage $VDD_{BOOST}$ of logic "1" through an inverter 518, to achieve the same effect of dynamic voltage scaling.

Figure 7A:
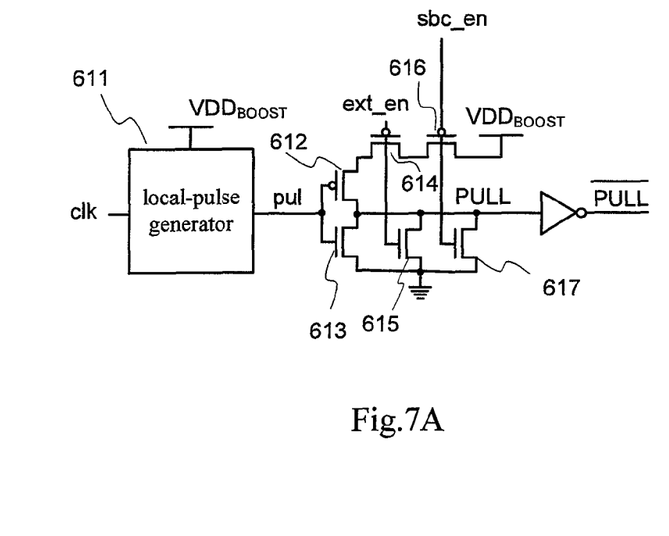
FIG. 7A is a circuit diagram of a Stage-Pulse Generator according to an embodiment of the present invention.
Figure 7B:
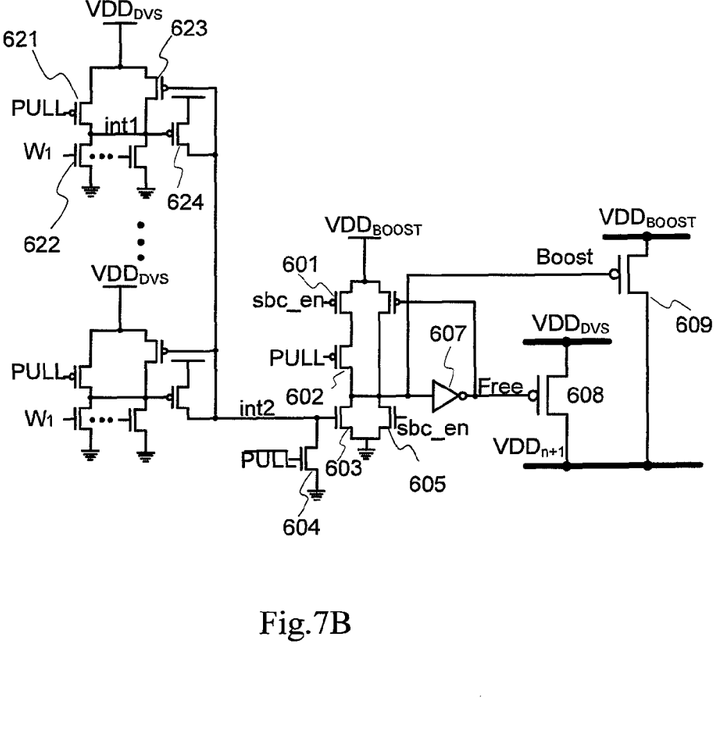
FIG. 7B is a circuit diagram of a Local Boost Circuit according to an embodiment of the present invention.

Then, refer to FIGS. 7A and 7B respectively for a circuit diagram of a

Stage-Pulse Generator according to the present invention, and a circuit diagram of a local boost circuit according to the present invention. Wherein, the Stage-Pulse Generator is used to generate the control signal required by the controller, while the local boost circuit is used to determine if the pipeline needs local boost based on the warning signal W1.

To be more specific, as shown in FIG. 7A, the Stage-Pulse Generator is formed by the local boost circuit 611 (its structure is the same as that in FIG. 5B) and FETs 612, 613, 614, 615, 616, and 617. When the input voltage sbc_en or ext_en is at logic "1", the FETs 615 or 617 is turned on, so that node PULL is discharged to logic "0". When the node PULL is at logic "0", the local boost circuit remains in a pre-charge state. When the input voltage sbc_en or ext_en are both at logic "0", the FETs 615 and 617 are turned off, while FETs 614 and 616 are turned on. At this time, in case node pu1 is at logic "0", then FET 612 is turned on, while FET 613 is turned off, so as to make node PULL discharge to logic "1". On the contrary, in case node pu1 is at logic "1", then FET 612 is turned off while FET 613 is turned on, so as to make node PULL discharge to logic "0". At this time, when the node PULL is charged to logic "1", the Local Boost Circuit determines if it is required to perform Local Boost based on the warning signal.

During operations of the Local Boost Circuit, when the node sbc_en is at logic "1", at this time the circuit is not in a dynamic voltage scaling (DVS) state, the FET 605 is turned on, to make the voltage boost signal Boost discharge to logic "0". The voltage boost signal Boost charges the voltage maintenance signal Free to logic "1" through an inverter 607. At this time, FET 608 is turned off, while FET 609 is turned on, to charge the secondary stage power supply line $VDD_{n+1}$ to the level of high working voltage line $VDD_{BOOST}$. At this time, the circuit does not perform dynamic voltage scaling, to remain at the highest voltage of the system.

When the node sbc_en is at logic "0", then the circuit is in a dynamic voltage scaling (DVS) state, such that the secondary stage power supply line $VDD_{n+1}$ is controlled by a local boost circuit. When the node PULL is at logic "0", the Local Boost Circuit is in a pre-charge state, so that the FETs 601, 602, 604, 611 are turned on, while FETs 605 and 623 are turned off, to make the voltage boost signals Boost and int1 to be pre-charged to logic "1", and int2 to be pre-discharged to logic "0", such that FET 608 is turned on, FET 609 is turned off, and the secondary stage power supply line $VDD_{n+1}$ is charged to a low working voltage $VDD_{DVS}$. When node PULL is at logic "1", the system determines if it is required to perform Local Boosting. At this time FETs 602, 604, 621 are turned off. In case the warning signal W1 is at logic "0" (namely, the transition detector does not detect transition state delay of input data), then int1 is kept at logic "1", FET 624 is turned off, int2 remains at logic "0", the voltage boost signal Boost remains at logic "1", the voltage maintenance signal Free remains at logic "0", while low working voltage $VDD_{DVS}$ is provided to the secondary stage power supply line $VDD_{n+1}$. When any of the Transition Detectors detects state transition delay of data, then the warning signal W1 is turned to logic "1", FET 622 is turned on, so that int1 is discharged to logic "0". Therefore, FET 624 is turned on, so the int2 is charged to logic "1". Then, FET 603 is turned on, to make the voltage boost signals Boost discharged to logic "0", while the voltage maintenance signal Free is charged to logic "1". Therefore, FET 608 is turned off, FET 609 is turned on, the secondary stage power supply line $VDD_{n+1}$ is charged to high working voltage $VDD_{BOOST}$. At this time, the pipeline is in a local boosting state, to increase the operation speed of the secondary stage pipeline logic circuit.

In the Razor-based dynamic voltage scaling system of the prior art, when delay fault occurs, quite a lot of cycle periods are required to make data recovery of the system, thus reducing its system performance. The present invention proposes a novel circuit system to solve the problem of delay fault. Firstly, a Time borrowing Circuit enables the delayed system data to borrow time from the next stage pipeline to perform operations, so that the pipeline will not stop temporarily for the delay fault. On the other hand, the Local Boost Circuit performs local boosting of operation voltage temporarily for the next stage pipeline, to raise significantly the speed for the next stage pipeline, to offset operation time borrowed by the preceding stage pipeline.

Figure 8:
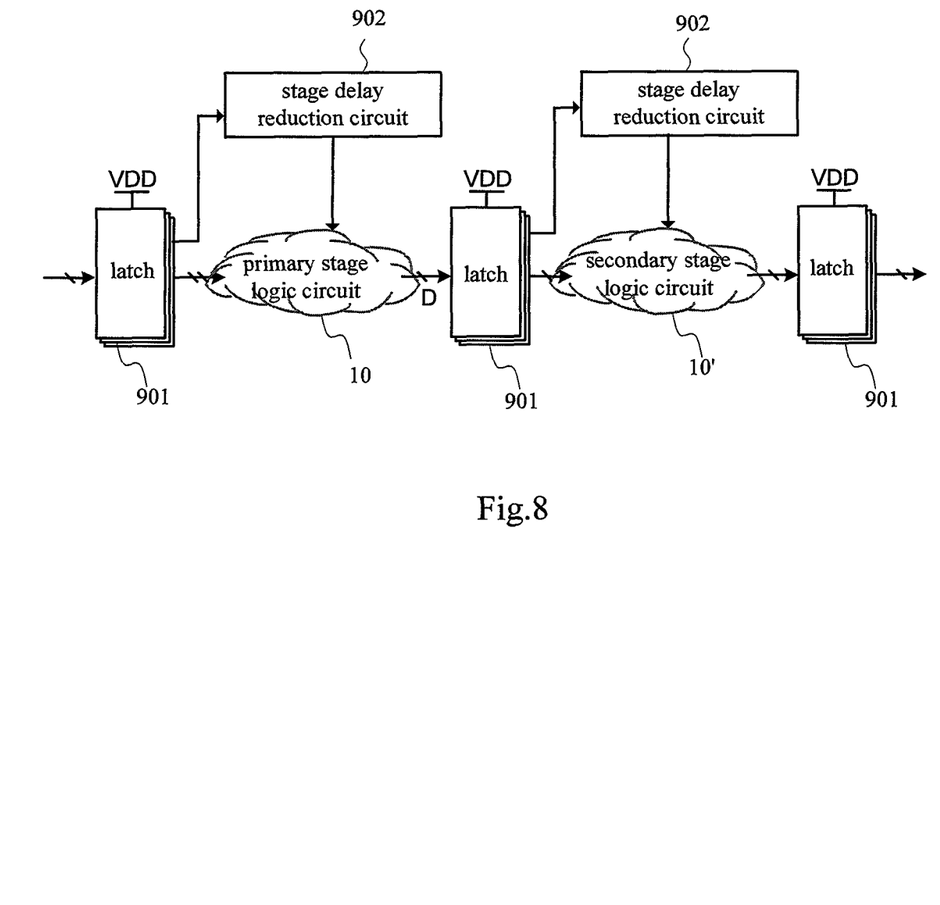
FIG. 8 is a circuit diagram designed through using a dynamic voltage scaling system having time borrowing and local boosting capability according to an embodiment of the present invention.

Moreover, please refer to FIG. 8 which is an embodiment of circuit diagram designed through using a dynamic voltage scaling system having time borrowing and local boosting capability of the preset invention. As shown in FIG. 8, the Dynamic Voltage Scaling (DVS) system 901 of the present invention is further connected to a stage delay reduction circuit 902 and the stage delay reduction circuit 902 is disposed between the DVS system 901 and/or the primary/secondary stage logic circuit 10/10'. As previously described, according to the embodiment of the present invention, when the time borrowing circuit 100 generates the warning signal $W_1$, the time borrowing circuit 100 utilizes the level-converter latch (LCL) 102 to perform time borrowing from its next stage pipeline. Meanwhile, it decreases operation time of the next stage pipeline through the stage delay reduction circuit 902. Therefore, the delay fault of the next stage pipeline can be offset and its power consumption can also be reduced. According to an embodiment of the present invention, for example, the stage delay reduction circuit 902 can be implemented by boosting supply voltage or forwarding body-bias, however, the present invention is not limited thereto.

When circuits are affected by process-voltage-temperature (PVT) variations, the operation speed of the circuits is reduced. If input data and complexity of the circuits are different, variation delays due to PVT variations are different. When the variations seriously affect the circuits to violate timing constraint and the system can not operate to comply with the specification originally designed, time-based load balancing (TBLB) technology solves the problem to improve the variation tolerance for the system.

Figure 9:
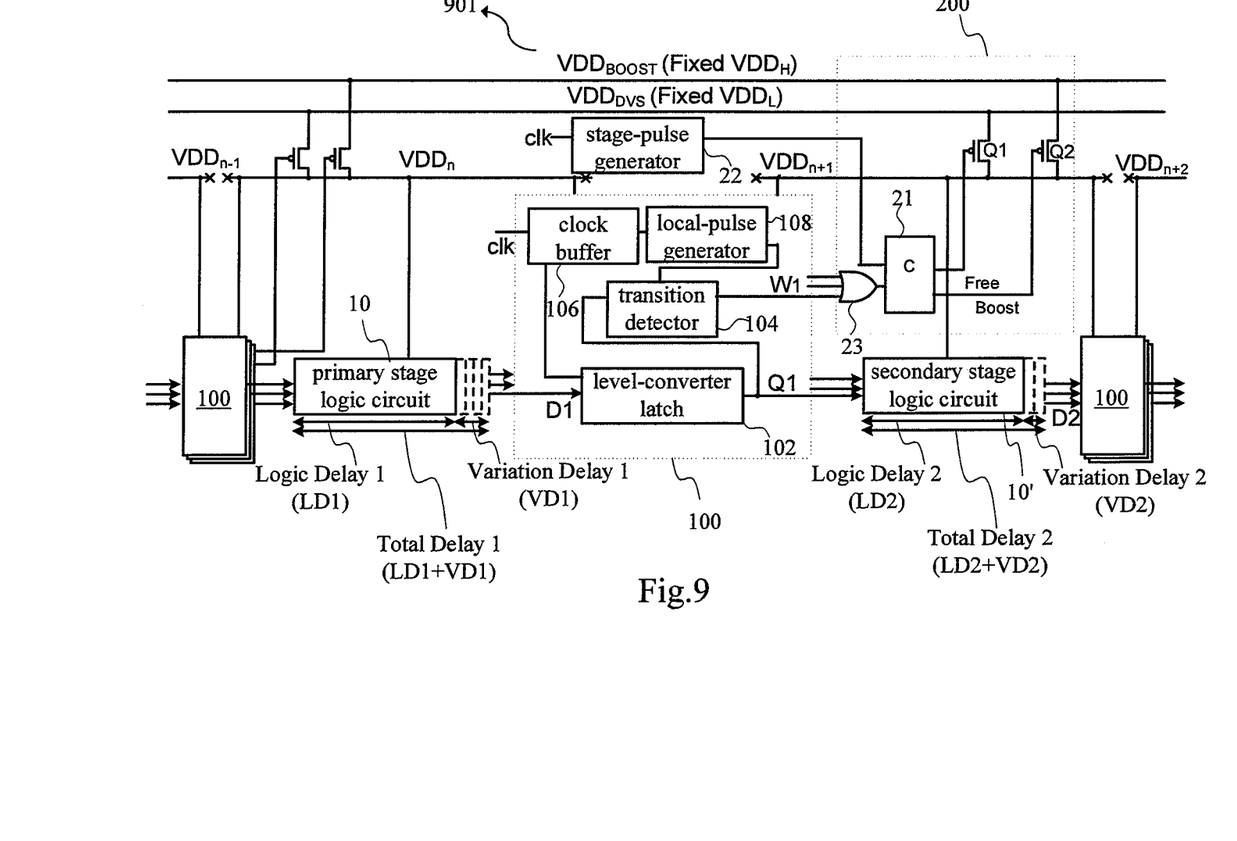
FIG. 9 is a circuit diagram of a dynamic voltage scaling system with process-voltage-temperature (PVT) variations according to an embodiment of the present invention.

Refer to FIG. 9. When the operation voltages $VDD_{BOOST}$ and $VDD_{DVS}$ are unchanged and the primary stage logic circuit 10 and the secondary stage logic circuit 10' are affected by PVT variations, a variation delay 1 (VD1) and a variation delay 2 (VD2) are generated. The primary stage logic circuit 10 originally operates for a logic delay 1 (LD1). The LD1 plus the VD1 equals to a total delay 1. When the total delay 1 is too long so that the primary stage logic circuit 10 violates timing constraint, TBLB technology can detects a delay error 1 and boosts the operation voltage of the secondary stage logic circuit 10' to $VDD_{BOOST}$ to increase the operation speed of the secondary stage logic circuit 10' and offset the borrowing time of the primary stage logic circuit 10. Before next positive edge of the clk triggers, the secondary stage logic circuit 10' figures out a correct value whereby the system operates normally.

Figure 10:
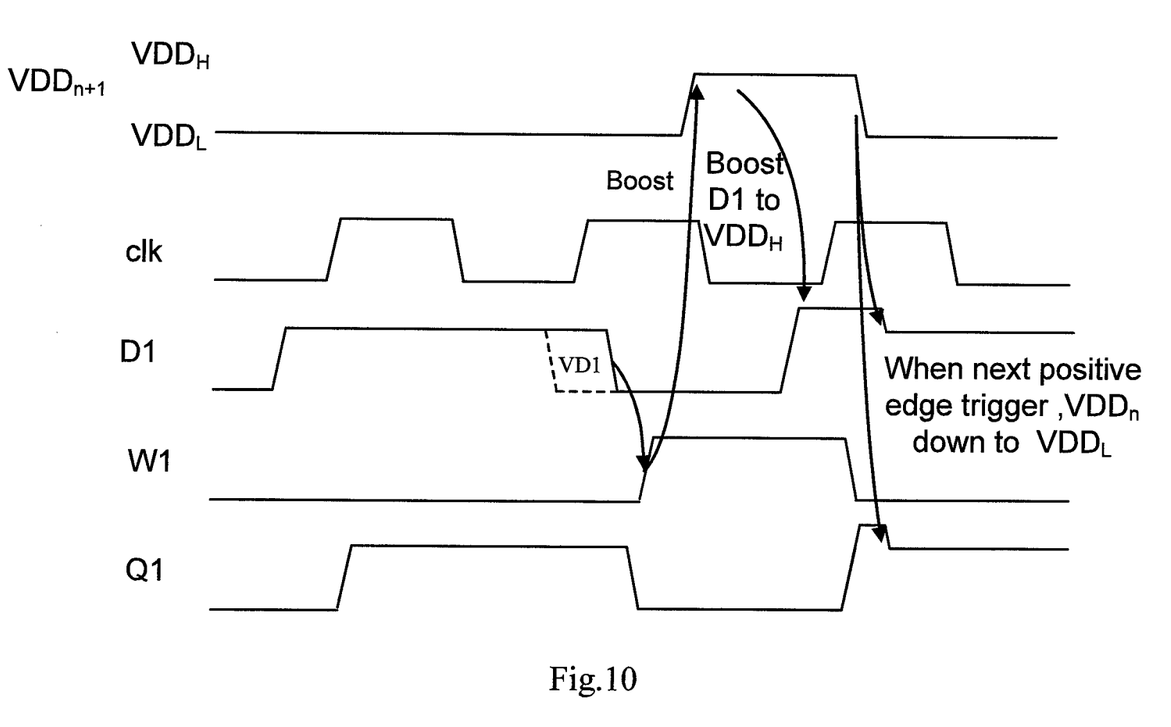
FIG. 10 is a time sequence waveform diagram with PVT variations according to an embodiment of the present invention.

Refer to FIG. 10. When VD1 is too long such that D1 changes its state in the positive semi-period of the next cycle, W1 raises to High and $VDD_{n+1}$ raises from $VDD_L$ to $VDD_H$. As a result, the operation voltage in the second cycle is increased whereby the operation speed of the circuits is increased to offset the operation time spent due to too long VD1. After the positive edge of the third cycle triggers the circuits, W1 descends to 0 and $VDD_{n+1}$ descends to $VDD_L$, so that all the circuits operate at lower operation voltage to save power.

Summing up the above, the present invention discloses a dynamic voltage scaling system having time borrowing and local boosting capability, that is a novel, inventive, and non-obvious circuit technology of a sub-threshold voltage circuit. It can not only increase system data throughput, but it can also enable the system to operate at an optimal voltage through the dynamic voltage scaling based on the warning rate, hereby reducing significantly power consumption of the system. In addition, it can also offset the delay fault caused by process variations, to reduce effect of process variations.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A dynamic voltage scaling system having time borrowing and local boosting capability, including:
   a time borrowing circuit, connected electrically between a primary stage logic circuit and a secondary stage logic circuit, said time borrowing circuit receives an all-domain clock signal, and generates an output data to said secondary stage logic circuit based on input data of said primary stage logic circuit; and
   a local boost circuit, connected electrically to said time borrowing circuit and said secondary stage logic circuit, and is connected to a low working voltage line, wherein, when said input data lags behind a positive level of said all-domain clock signal, said time borrowing circuit changes its state to produce a warning signal, so that said local boost circuit disconnects its connection to said low working voltage line based on said warning signal, and then is connected electrically to a high working voltage line.

2. The dynamic voltage scaling system having time borrowing and local boosting capability as claimed in claim 1, wherein said local boost circuit includes a first active switch and a second active switch, a source of said first active switch is connected to said low working voltage line, and a source of said second active switch is connected to said high working voltage line, to switch selectively the electrical connection between said local boost circuit and said low working voltage line or said high working voltage line.

3. The dynamic voltage scaling system having time borrowing and local boosting capability as claimed in claim 2, wherein said first active switch and said second active switch are P-type metal-oxide-semiconductor field-effect-transistors (MOSFETs).

4. The dynamic voltage scaling system having time borrowing and local boosting capability as claimed in claim 2, wherein
   said local boost circuit further includes:
   a controller, connected to said first active switch and said second active switch, to generate a voltage maintenance signal to a base of said first active switch, and a voltage boost signal to a base of said second active switch; and
   a logic gate, connected between said time borrowing circuit and said controller.

5. The dynamic voltage scaling system having time borrowing and local boosting capability as claimed in claim 4, wherein an input terminal of said controller is connected electrically to a stage-pulse generator.

6. The dynamic voltage scaling system having time borrowing and local boosting capability as claimed in claim 1, wherein
   said time borrowing circuit includes:
   a level-converter latch (LCL), connected between said primary stage logic circuit and said secondary stage logic circuit;
   a transition detector, connected to said level-converter latch, to generate said warning signal;
   a clock buffer, used to receive said all-domain clock signal; and
   a local-pulse generator, connected between said clock buffer and said transition detector.

7. The dynamic voltage scaling system having time borrowing and local boosting capability as claimed in claim 6, wherein said level-converter latch (LCL) includes: a first inverter, a second inverter, a third inverter, and a fourth inverter, a first transistor, a second transistor, a third transistor, a fourth transistor, a fifth transistor, a sixth transistor, a seventh transistor, an eighth transistor, a ninth transistor, wherein, a source of PMOS of said first inverter is connected to a primary stage power supply line, a source of PMOS of said second inverter, a source of PMOS of said third inverter, a source of PMOS of said fourth inverter, a source of said second transistor, a source of said fourth transistor, are connected to a secondary stage power supply line, a source of NMOS of said first inverter, a source of NMOS of said second inverter, a source of NMOS of said third inverter, a source of NMOS of said fourth inverter, a source of said eighth transistor, are connected to ground, input data is input to an input terminal of said first inverter, an output terminal of said first inverter is connected electrically to source of said sixth transistor and source of said second transistor, a drain of said sixth transistor and a drain of said second transistor are connected electrically to said input terminal of said second inverter, said input terminal of said third inverter, a drain of said third transistor and a drain of said seventh transistor, an output terminal of said second inverter is used to output said output data, said third inverter is connected electrically to a gate of said third transistor and a gate of said seventh transistor, an inverter clock signal line is connected electrically to a drain of said ninth transistor and a source of said fifth transistor, a clock signal line is connected electrically to a gate of said first transistor, said voltage boost signal is input to a gate of said fourth transistor and a gate of said ninth transistor, said voltage maintenance signal is input to a gate of said fifth transistor, a drain of said fourth transistor is connected electrically to a drain of said ninth transistor, a drain of said fifth transistor, a gate of said first transistor, and an input terminal of said fourth inverter.

8. The dynamic voltage scaling system having time borrowing and local boosting capability as claimed in claim 7, wherein said first transistor, said second transistor, said third transistor, said fourth transistor, and said fifth transistor are P-type metal-oxide-semiconductor field-effect-transistors (MOSFETs).

9. The dynamic voltage scaling system having time borrowing and local boosting capability as claimed in claim 7, wherein said sixth transistor, said seventh transistor, said eighth transistor, and said ninth transistor, are N-type metal-oxide-semiconductor field-effect-transistors (MOSFETs).

10. The dynamic voltage scaling system having time borrowing and local boosting capability as claimed in claim 6, wherein when said time borrowing circuit generates said warning signal, said time borrowing circuit utilizes said level-converter latch (LCL) to perform time borrowing through a next stage pipeline, and is connected to said high working voltage line through said local boost circuit.

11. The dynamic voltage scaling system having time borrowing and local boosting capability as claimed in claim 6, further connected to a stage delay reduction circuit, wherein said stage delay reduction circuit is disposed between said dynamic voltage scaling system and said secondary stage logic circuit, when said time borrowing circuit generates said warning signal, said time borrowing circuit utilizes said level-converter latch (LCL) to perform time borrowing through a next stage pipeline, and decreases operation time of said next stage pipeline through said stage delay reduction circuit so as to offset its delay fault and reduce power consumption.

12. The dynamic voltage scaling system having time borrowing and local boosting capability as claimed in claim 11, wherein said stage delay reduction circuit is implemented by boosting supply voltage.

13. The dynamic voltage scaling system having time borrowing and local boosting capability as claimed in claim 11, wherein said stage delay reduction circuit is implemented by forwarding body-bias.

* * * * *